United States Patent
Faibish et al.

(10) Patent No.: US 11,500,540 B2
(45) Date of Patent: Nov. 15, 2022

(54) ADAPTIVE INLINE COMPRESSION

(71) Applicant: EMC IP Holding Company LLC, Hopkinton, MA (US)

(72) Inventors: Sorin Faibish, Newton, MA (US); Ivan Bassov, Brookline, MA (US); Istvan Gonczi, Berkley, MA (US); Philippe Armangau, Acton, MA (US); Vamsi K. Vankamamidi, Hopkinton, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 17 days.

(21) Appl. No.: 17/082,800

(22) Filed: Oct. 28, 2020

(65) Prior Publication Data

US 2022/0129162 A1    Apr. 28, 2022

(51) Int. Cl.
*G06F 3/06* (2006.01)

(52) U.S. Cl.
CPC ............ *G06F 3/0608* (2013.01); *G06F 3/064* (2013.01); *G06F 3/067* (2013.01); *G06F 3/0653* (2013.01)

(58) Field of Classification Search
CPC ...... G06F 3/0608; G06F 3/064; G06F 3/0653; G06F 3/067
See application file for complete search history.

(56) References Cited

U.S. PATENT DOCUMENTS

| | | | |
|---|---|---|---|
| 5,870,036 A * | 2/1999 | Franaszek | H04N 19/94 341/51 |
| 10,614,038 B1 | 4/2020 | Armangau et al. | |
| 10,838,643 B2 | 11/2020 | Faibish et al. | |
| 2007/0005901 A1* | 1/2007 | Kellar | G06F 12/0886 711/137 |
| 2018/0225299 A1* | 8/2018 | Gupta | G06F 16/1744 |
| 2020/0133928 A1 | 4/2020 | Armangau et al. | |

OTHER PUBLICATIONS

Shabi, Uri, et al.; "Deduplicating Full and Partial Block Matches," U.S. Appl. No. 16/668,523, filed Oct. 30, 2019.
Shabi, Uri, et al.; "Selectively Performing Inline Compression Based on Data Entropy," U.S. Appl. No. 16/669,160, filed Oct. 30, 2019.
Armangau, Philippe, et al.; "Deduplication of Large Block Aggregates Using Representative Block Digests," U.S. Appl. No. 16/527,894, filed Jul. 31, 2019.

* cited by examiner

*Primary Examiner* — David Yi
*Assistant Examiner* — Dustin B. Fulford
(74) *Attorney, Agent, or Firm* — BainwoodHuang

(57) ABSTRACT

A technique for managing data storage includes generating entropy of blocks on a per-block basis and selectively performing inline compression on blocks based at least in part on their entropy. Entropy of a block provides a rough measure of the block's compressibility. Thus, using per-block entropy enables a storage system to steer compression decisions, e.g., whether to compress and/or how much to compress, flexibly and with high granularity, striking a balance between throughput and storage efficiency.

16 Claims, 6 Drawing Sheets

ADAPTIVE INLINE COMPRESSION

BACKGROUND

Data storage systems are arrangements of hardware and software in which storage processors are coupled to arrays of non-volatile storage devices, such as magnetic disk drives, electronic flash drives, and/or optical drives. The storage processors service storage requests, arriving from host machines ("hosts"), which specify blocks, files, and/or other data elements to be written, read, created, deleted, and so forth. Software running on the storage processors manages incoming storage requests and performs various data processing tasks to organize and secure the data elements on the non-volatile storage devices.

Some storage systems improve efficiency by compressing data inline with write requests. For example, a storage system receives a write request specifying data to be written. The storage system arranges the data into blocks and compresses the blocks prior to flushing them to disk. The first storage to disk of the newly-arriving data is thus in the form of compressed blocks. Later, when the system receives a read request to access the same data, the system reads the compressed blocks from disk, decompresses them, and returns the decompressed data to the requestor.

Some storage systems that support inline compression implement a back-off feature. Back-off temporarily shuts down inline compression when the systems get too busy. Inline compression can add greatly to the processing load of a storage system and can thus prevent the system from achieving desired throughput. Throughput is typically measured as latency (response time to input/output (I/O) requests) and/or IOPs (I/O's per second). A storage system may detect or predict a drop in throughput and invoke the back-off feature to correct or prevent the reduction in service. Back-off effectively shuts down inline compression, such that the storage system no longer compresses blocks and simply writes them to disk without compressing them.

SUMMARY

Unfortunately, known back-off features tend to operate in an all-or-none manner. Either no incoming blocks are compressed, when a system is too busy, or all of them are, when the system is not too busy. This all-or-none operation can result in many highly-compressible blocks remaining uncompressed. Although back-off helps to preserve throughput by stopping compression when systems get busy, it typically does so at the expense of storage efficiency, as many opportunities to compress data are lost. Customers increasingly demand both high throughput and high storage efficiency. Thus, a more flexible approach is needed.

In contrast with the above-described arrangement, in which back-off is implemented as an all-or-none feature, an improved technique for managing data storage includes generating entropy of blocks on a per-block basis and selectively performing inline compression on blocks based at least in part on their entropy. Entropy of a block can be computed inexpensively and provides a rough measure of the block's compressibility. Thus, using per-block entropy enables a storage system to steer compression decisions, e.g., whether to compress and/or how much to compress, flexibly and with high granularity, striking a balance between throughput and storage efficiency.

Certain embodiments are directed to a method of managing data storage. The method includes receiving data, generating entropy values of respective blocks of the data, selectively compressing the blocks of the data based on the entropy values, and persisting the data, including persisting compressed blocks for at least some of the data.

Other embodiments are directed to a computerized apparatus constructed and arranged to perform a method of managing data storage, such as the method described above. Still other embodiments are directed to a computer program product. The computer program product stores instructions which, when executed on control circuitry of a computerized apparatus, cause the computerized apparatus to perform a method of managing data storage, such as the method described above.

The foregoing summary is presented for illustrative purposes to assist the reader in readily grasping example features presented herein; however, this summary is not intended to set forth required elements or to limit embodiments hereof in any way. One should appreciate that the above-described features can be combined in any manner that makes technological sense, and that all such combinations are intended to be disclosed herein, regardless of whether such combinations are identified explicitly or not.

BRIEF DESCRIPTION OF THE SEVERAL VIEWS OF THE DRAWINGS

The foregoing and other features and advantages will be apparent from the following description of particular embodiments, as illustrated in the accompanying drawings, in which like reference characters refer to the same or similar parts throughout the different views.

DETAILED DESCRIPTION

Embodiments of the improved technique will now be described. One should appreciate that such embodiments are provided by way of example to illustrate certain features and principles of the disclosure but are not intended to be limiting.

An improved technique for managing data storage includes generating entropy of blocks on a per-block basis and selectively performing inline compression on blocks based at least in part on their entropy. Unlike prior back-off solutions, which can sacrifice data reduction to maintain high throughput, the improved technique can achieve a better balance between both. For example, highly compressible blocks can be compressed, promoting storage efficiency, while uncompressible blocks can be skipped, preserving high throughput. In some examples, a storage system supports multiple levels of compression, e.g., with a first level providing lower compression but executing faster, and a second level providing higher compression but executing more slowly. In some examples, entropy values steer not only decisions on whether to compress but also which level of compression to use. Such examples provide an even finer degree of granular control over the tradeoff between throughput and storage efficiency.

Figure 1:
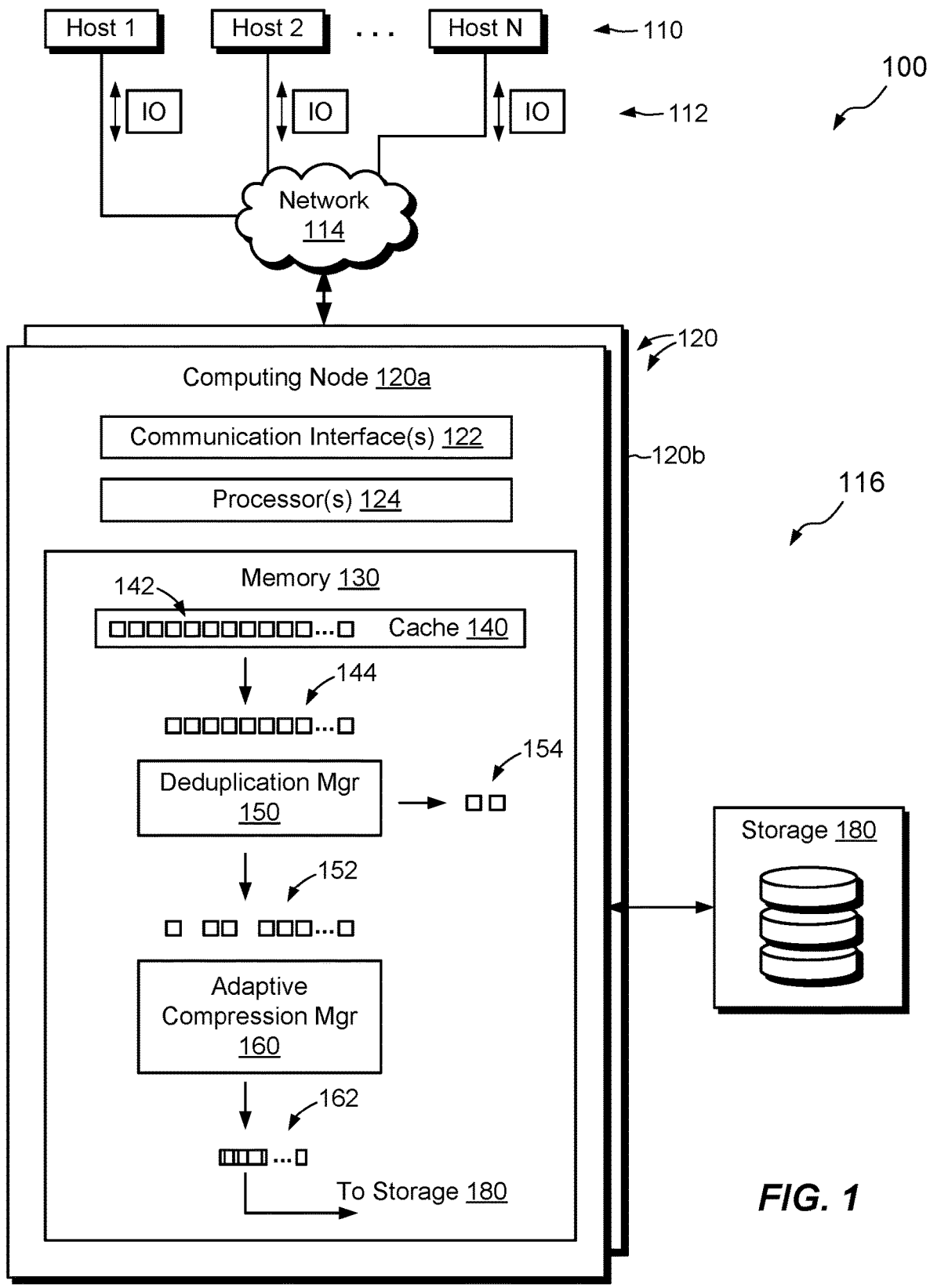
FIG. 1 is a block diagram of an example environment in which embodiments of the improved technique can be practiced.

FIG. 1 shows an example environment 100 in which embodiments of the improved technique can be practiced. As shown, multiple hosts 110 are arranged to access a data storage appliance 116 over a network 114. The data storage appliance 116 includes a computing node 120a (also referred to as a "node," "storage processor," or "SP") and storage 180, such as magnetic disk drives, electronic flash drives, and/or the like. The data storage appliance 116 may include multiple nodes 120 (e.g., a second node 120b). Multiple nodes 120 may be provided as circuit board assemblies or blades, which plug into a chassis that encloses and cools the nodes 120. The chassis has a backplane for interconnecting the nodes 120, and additional connections may be made among nodes 120 using cables. In some examples, the appliance 116 is part of a storage cluster, such as one that contains any number of storage appliances 116, where each appliance includes a pair of nodes 120 coupled to shared storage devices. In some arrangements, a host application runs directly on a node (or nodes), such that separate host machines 110 need not be present. No particular hardware configuration is required, and any number of nodes 120 may be provided, including a single node 120, in any arrangement, and the node or nodes 120 can be any type of computing device capable of running software and processing host I/O's.

The network 114 may be any type of network or combination of networks, such as a storage area network (SAN), a local area network (LAN), a wide area network (WAN), the Internet, and/or some other type of network or combination of networks, for example. In cases where hosts 110 are provided, such hosts 110 may connect to the SP 120a using various technologies, such as Fibre Channel, iSCSI (Internet small computer system interface), NFS (network file system), and CIFS (common Internet file system), for example. As is known, Fibre Channel and iSCSI are block-based protocols, whereas NFS and CIFS are file-based protocols. Each node 120 is configured to receive I/O requests 112 according to block-based and/or file-based protocols and to respond to such I/O requests 112 by reading or writing the storage 180.

As shown, the node 120a includes one or more communication interfaces 122, a set of processors 124, and memory 130. The communication interfaces 122 include, for example, SCSI target adapters and/or network interface adapters for converting electronic and/or optical signals received over the network 114 to electronic form for use by the node 120a. The processor(s) 124 include one or more processing chips and/or assemblies, such as numerous multi-core CPUs (central processing units). The processor(s) 124 may further include one or more coprocessors, one example being the QAT (Quick Assist Technology) Adapter, available from Intel® Corporation of Santa Clara, Calif. The QAT provides hardware acceleration for data compression and decompression.

The memory 130 includes both volatile memory, e.g., RAM (Random Access Memory), and non-volatile memory, such as one or more ROMs (Read-Only Memories), disk drives, solid state drives, and the like. The processor(s) 124 and memory 130 together form control circuitry, which is constructed and arranged to carry out various methods and functions as described herein. Also, the memory 130 includes a variety of software constructs realized in the form of executable instructions. When the executable instructions are run by the processor(s) 124, the processor(s) 124 carry out the operations of the software constructs. Although certain software constructs are specifically shown and described, it is understood that the memory 130 typically includes many other software components, which are not shown, such as an operating system, various applications, processes, and daemons.

As further shown in FIG. 1, the memory 130 "includes," i.e., realizes by execution of software instructions, a cache 140, a deduplication manager 150, and an adaptive compression manager 160. The cache 140 is configured to receive incoming data from hosts 110, e.g., in response to write requests issued by applications running thereon, and to arrange the data in blocks 142. A "block" is a storage extent that usually corresponds to a smallest addressable unit of storage space. Block sizes are typically uniform for any given storage system and can vary between storage systems, with typical block sizes being 4 kB (kilobytes) or 8 kB, for example. In some examples, the cache 140 is further configured to arrange blocks 142 based on LUN (Logical UNit) and/or based on logical address, such that logically contiguous blocks may be arranged in order.

The deduplication manager 150 is configured to perform inline deduplication. Such deduplication may proceed by computing digests (e.g., hash values) of blocks 142 and attempting to match the digests to those stored in a digest cache (not shown). A match of the digest of a new block to an entry in the digest cache identifies a block that has already been stored, and the deduplication manager 150 can effect storage of the new block by arranging pointers but without having to redundantly store of the matched block.

The adaptive compression manager 160 is configured to perform compression on blocks 142 selectively based on generated values of entropy. As is known, the "entropy" of a block provides a measure of the block's information content. Entropy may be expressed, for example, as a percentage that varies between 0% and 100%. A block with low entropy has low information content and high internal redundancy, whereas a block with high entropy has high information content and low internal redundancy. Given that data compression generally works by removing redundancy, the entropy of a block provides a good prediction of that block's compressibility. For instance, a low-entropy block tends to be highly compressible and a high-entropy block tends to be uncompressible, or nearly so. Computations of entropy are known in the art, but they typically involve floating-point arithmetic, which can be burdensome to processors and difficult to use in high-throughput applications.

Fortunately, an efficient technique has been developed for computing entropy without requiring floating-point arithmetic. An example of such a technique is disclosed in copending U.S. application Ser. No. 16/669,160, filed Oct. 30, 2019, the contents and teachings of which are incorporated herein by reference. In some examples, the adaptive compression manager 160 applies the efficient technique of the incorporated application for computing the entropy of blocks at low computational cost. The incorporated technique is not required, however, as it is still possible for embodiments to use less efficient techniques for computing entropy to great advantage.

In example operation, the hosts 110 issue I/O requests 112 to the data storage appliance 116. Node 120a receives the I/O requests 112 at the communication interface(s) 122 and initiates further processing. In the case of write I/O requests, node 120s receives data specified by such requests into cache 140. The data may arrive from hosts 110 in various size increments, which typically range, for example, from 512 B (0.5 kB) to 256 kB. Cache 140 may arrange the incoming data in blocks 142, e.g., 4-kB blocks. Cache 140 may further arrange blocks 142 based on LUN, based on logical address, and/or based on other factors.

At some point, cache 140 may perform a flush operation to flush certain blocks to lower-level structures (e.g., a mapping subsystem, RAID subsystem, etc.; not shown), which place the blocks into persistent structures in the storage 180. The flush operation may work on one batch of blocks at a time, such as batch 144. Each batch typically includes at least several blocks, and up to thousands of blocks. In various examples, flushing is repeated at regular intervals and may be conducted in parallel by multiple threads running on node 120a.

Upon the cache 140 initiating a flush of batch 144, the deduplication manager 150 checks the blocks in the batch 144 for matches to blocks recorded in the digest cache. In the example shown, blocks 154 are found to match blocks that are already stored in the storage appliance 116. Such blocks 154 may be pulled out of the batch 144 and deduplicated, e.g., by associating logical addresses of the blocks 154 with respective locations of matching blocks in storage 180. The remaining blocks 152 may be processed for adaptive compression.

The adaptive compression manager 160 processes the batch 152 by computing entropy values of at least some of the blocks in batch 152 and steering compression decisions based on the computed entropy values. In one example, the compression manager 160 computes the entropy of each of the blocks in the batch 152 and uses the respective entropy values in deciding how to compress the respective blocks. For instance, the compression manager 160 may decide, based on a first block having moderate entropy, to compress the first block with a first compression procedure. Likewise, the compression manager 160 may decide, based on a second block having lower entropy, to compress the second block with a second compression procedure. The first compression procedure may execute faster than the second compression procedure but may yield a lesser degree of data compression than the second compression procedure. For convenience, the first compression procedure is referred to herein as "fast/low" and the second compression procedure is referred to herein as "slow/high," where "fast" and "slow" are used in a comparative sense, as are "high" and "low." Further, the compression manager 160 may decide, based on a third block having high entropy, not to compress the third block at all. The decision not to compress may be based on a prediction that the third block is not compressible, or that it is not compressible enough to justify the cost in throughput that compressing the third block would entail. Uncompressible blocks may include, for example, blocks that already contain compressed data, such as data of MPEG files, JPEG files, or the like. Although first and second compression procedures are described, one should appreciate that embodiments may provide any number of compression procedures, e.g., those covering a range of execution speeds and compression levels. Some embodiments may provide only a single compression level, however.

In another example, embodiments may use a sampling approach in generating the entropy of blocks, rather than computing the entropy of each and every block. Entropy may be computed, for example, on every other block, on every fourth block, on every hundredth block, and so on. Sampling may be especially attractive when blocks contain similar data, such as email data or video data. When using sampling, the adaptive compression manager 160 may use the entropy of sampled blocks as representatives of blocks that follow, and/or of other blocks in the same batch. Based on the entropy of a sampled block (or of multiple sampled blocks), a compression decision may be made, e.g., to use the first compression procedure, the second compression procedure, or no compression (also called "back-off"), and that decision can be applied to unsampled blocks as well as to sampled blocks.

Figure 2:
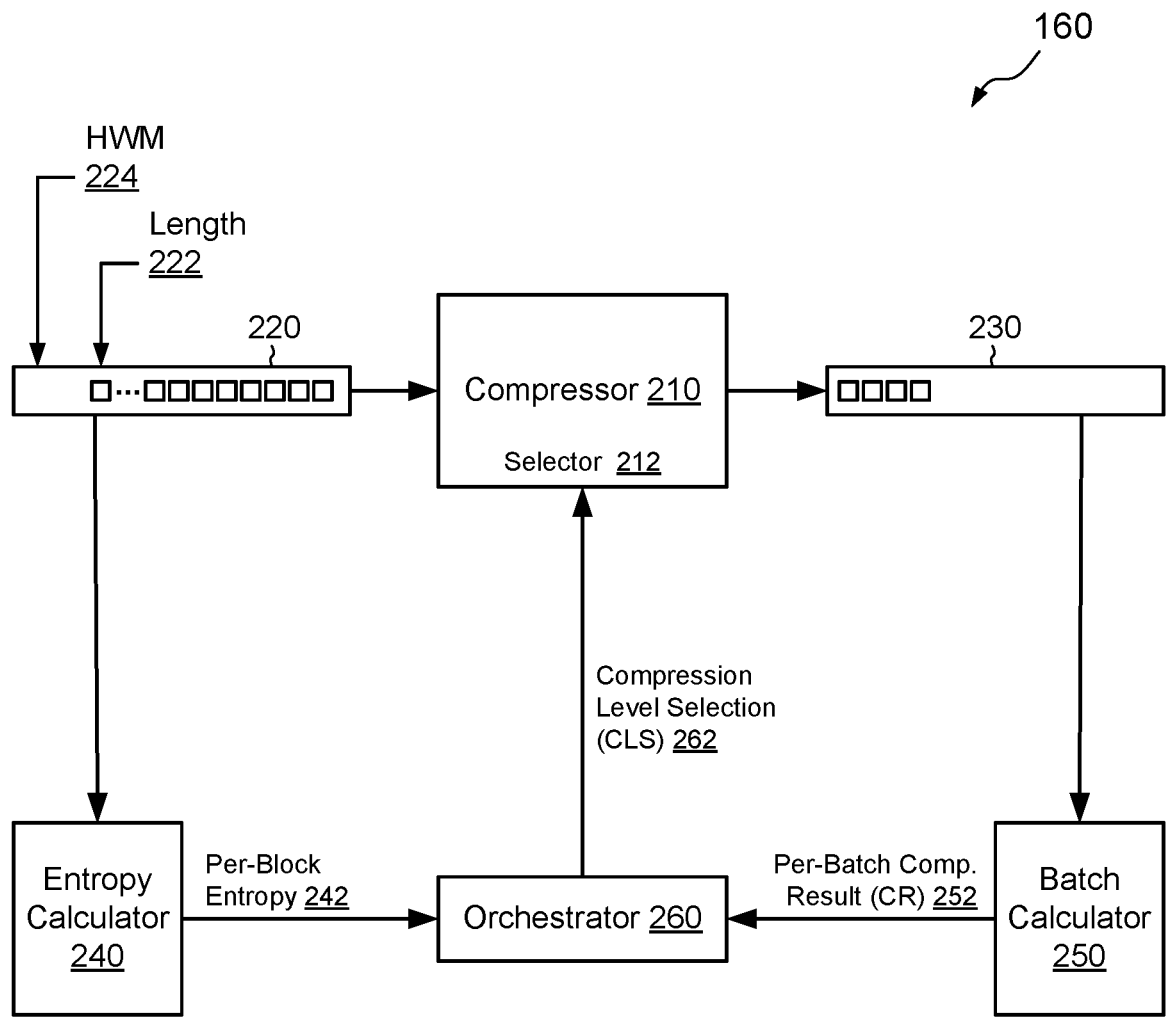
FIG. 2 is a block diagram of an example adaptive compression manager of FIG. 1.

FIG. 2 shows an example arrangement of the adaptive compression manager 160 of FIG. 1. Here, the adaptive compression manager 160 includes a compressor 210, an input queue 220, and an output queue 230. An entropy calculator 240 is operatively coupled to the input queue 220, and a batch calculator 250 is operatively coupled to the output queue 230. An orchestrator 260 is provided to control operations.

The compressor 210 may be implemented using hardware, software, firmware, or any combination thereof. In a particular example, the compressor 210 includes the above-described Intel QAT adapter, which provides hardware acceleration for data compression and decompression. The QAT adapter implements four levels of compression, referred to as L1-L4. In a particular embodiment, the above-described first (fast/low) compression level corresponds to QAT Adapter level L1, which roughly corresponds to Lempel-Ziv compression level LZ1. Also, the above-described second (slow/high) compression level corresponds to QAT Adapter level L4, which roughly corresponds to Lempel-Ziv compression level LZ9. QAT Adapter levels L2 and L3 may be used in some embodiments but are not illustrated in those which are depicted. For implementing no compression (e.g., back-off), it may be necessary to bypass the QAT adapter (e.g., if the QAT Adapter does not natively support a bypass function). Compressor 210 may implement a copy feature (not shown) for this purpose, e.g., one that identifies blocks in the input queue 220 for which no compression is specified and copies the identified blocks to the output queue 230.

As shown, the compressor 210 has a selector input 212, which is configured to receive a compression level selection (CLS) 262. The CLS 262 may specify, for example, the first (fast/low) compression procedure, the second (slow/high) compression procedure, some other compression procedure (if supported), or no compression (back-off). The compressor 210 is configured to respond to the CLS 262 on a per-block basis, for compressing blocks in the input queue 220 based on respective settings of the CLS 262. In an example, the compressor 210 is configured for pipelined operation, and the CLS 262 provides a pipelined sequence of settings, e.g., one setting for each of multiple blocks in the input queue 220.

In an example, the input queue 220 and output queue 230 are implemented in memory 130 of the computing node 120a (FIG. 1), as are the entropy calculator 240, batch calculator 250, and orchestrator 260. Although one input queue 220 and one output queue 230 are shown, any number of such queues may be provided. For example, the QAT Adaptor is known to include three endpoints that support three-way parallel compression. For implementations that employ the QAT Adaptor, the adaptive compression manager 160 may include three input queues 220 and three output queues 230, with the orchestrator 260 configured to load balance among them.

As further shown, the input queue 220 has a length 222 and a high-water mark (HWM) 224. The length 222 indicates a number of blocks waiting to be processed in the input queue 220, and the high-water mark 224 indicates a queue length at which the input queue 230 is close to being full. In an example, the high-water mark 224 is set to 90% of the maximum length of the input queue 220; however, other values may be used. Also, the high-water mark 224 may be adjustable.

The entropy calculator 240 is configured to generate values of per-block entropy 242, e.g., one entropy value for each block. In some examples, the entropy calculator 240 may operate on a sampling basis, such that entropy values need not be generated for each and every block. Per-block operation is described more fully in connection with FIG. 3A.

The batch calculator 250 is configured to select a desired per-batch compression result (CR) 252, e.g., for cases in which entropy or compressibility of certain blocks in a batch is used to steer compression decisions for other blocks in the same batch. Per-batch operation is described more fully in connection with FIG. 3B.

In some examples, the orchestrator 260 is configured to monitor the length 222 of the input queue 220 and respond to changes by modifying how compression is performed. For instance, the orchestrator 260 may temporarily disable the slow/high compression option when the length 222 exceeds the high-water mark 224 or some other threshold. Also, the orchestrator 260 may switch from per-block operation to per-batch operation depending on the length 222 of input queue 220.

Figure 3A:
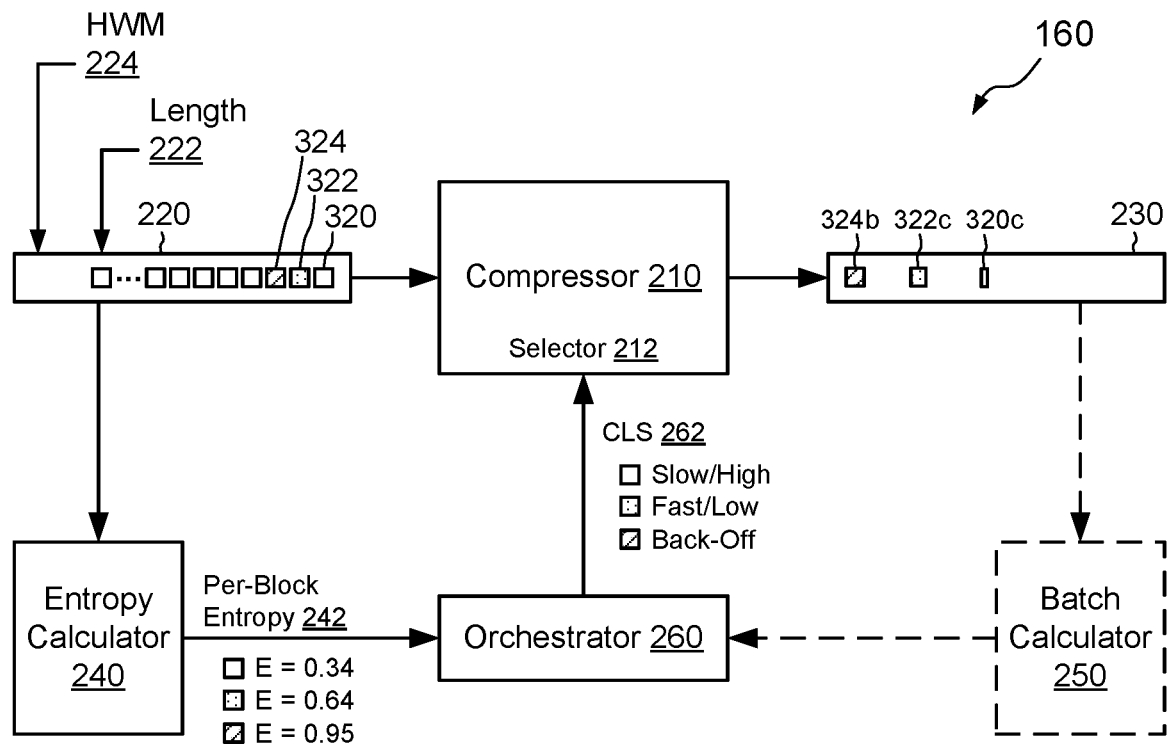
FIGS. 3A and 3B are respective block diagrams showing the adaptive compression manager of FIG. 2 arranged for processing compression on a per-block basis (FIG. 3A) and on a per-batch basis (FIG. 3B).

FIG. 3A shows an example of the adaptive compression manager 160 of FIG. 2 configured for per-block operation. Here, blocks in cache 140, such as blocks 320, 322, and 324, are arranged in the input queue 220. Entropy calculator 240 may generate the entropy of blocks in the input queue 220 on a first-in-first-out (FIFO) basis. For instance, entropy calculator 240 calculates an entropy E=0.34 for block 320, then calculates an entropy E=0.64 for block 322, then calculates an entropy E=0.95 for block 324, and so on. These entropy values may be input to orchestrator 260, which produces respective compression level settings (CLS) 262 for the respective entropy values. For example, orchestrator 260 selects slow/high compression for block 320, fast/low compression for block 322, and no compression (back-off) for block 324. Each selection is made based on the computed entropy of the respective block. The compressor 210 receives these settings 262 at selector input 212 and proceeds to implement the corresponding compression procedures (or no compression) for the corresponding blocks.

The output queue 230 shows example results of operation. As shown, compressed block 320c appears as a highly compressed version of block 320. Compressed block 322c appears as a somewhat less-highly compressed version of block 322. Also, block 324b appears as a back-off block, which is identical to block 324 as it appeared in the input queue 220.

In some examples, orchestrator 260 may base its per-block compression decisions on additional factors besides entropy. For example, some embodiments may store compression headers appended to compressed blocks but may not store such headers for uncompressed blocks. The header for a compressed block may include metadata, such as compressed size, compression procedure used in compressing the block, a checksum, and so forth. Where compression headers are used, the total size of a compressed block includes not only the size of the compressed data but also the size of the header. If the sum of compressed data plus header would approach or exceed the block size (e.g., 4 kB), the orchestrator 260 may opt for back-off, even if the data itself would compress to something smaller than the block size.

Processing with entropy sampling works the same way as per-block processing without sampling, except that entropy may be calculated on every $N^{th}$ block in the input queue 220, rather than on each and every block. In an example, the orchestrator 260 produces a CLS value 262 for every $N^{th}$ block and maintains that value until the next $N^{th}$ block is processed, at which point the CLS value 262 is changed to reflect the new entropy value.

Given that sampling does not separately consider the entropy of each block that gets compressed, sampling raises the risk that some compressed blocks may end up being larger than the block size, particularly when they include headers. To avoid this result, orchestrator 260 may check the sizes of blocks in the output queue 230 and replace any compressed blocks larger than the block size with their uncompressed counterparts. Such counterparts may still reside in cache 140.

Figure 3B:
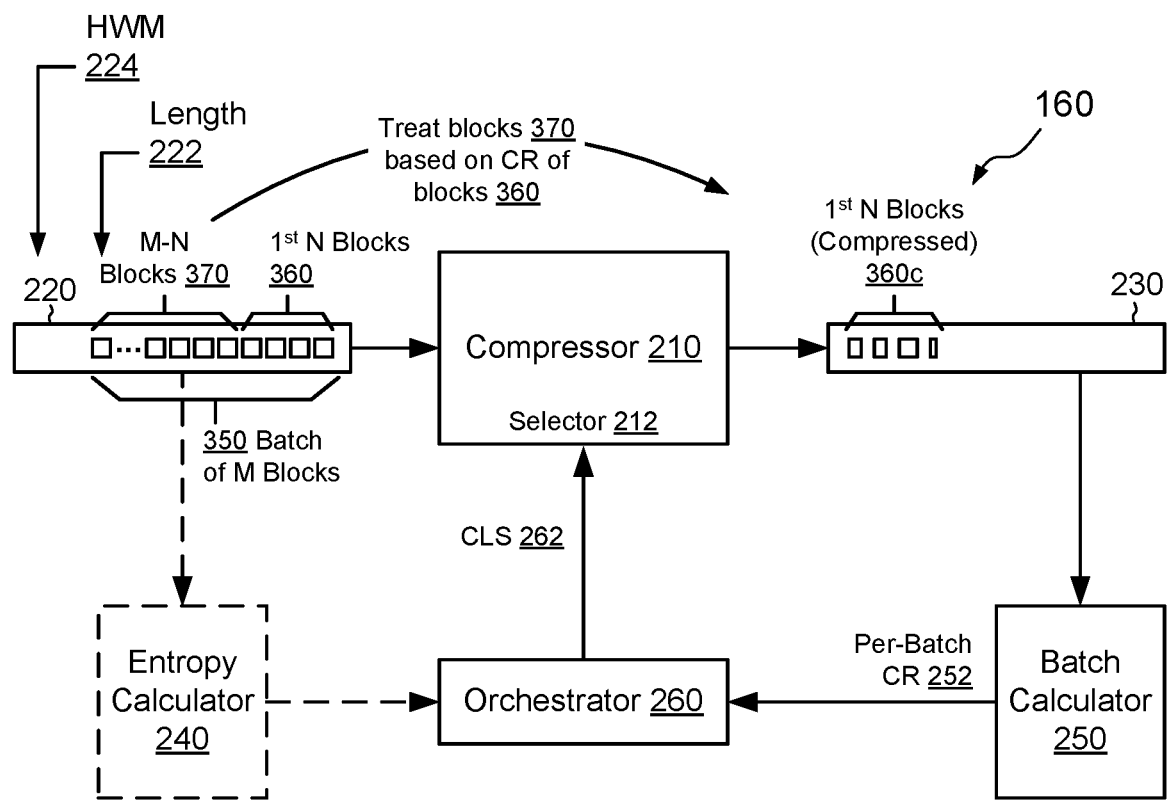

FIG. 3B shows an example of the adaptive compression manager 160 of FIG. 2 configured for per-batch operation. In some examples, the adaptive compression manager 160 switches from per-block processing to per-batch processing when its gets busy. Busyness may be estimated, for example, based on queue length 222. When queue length 222 exceeds the high-water mark 224, the adaptive compression manager 160 may switch from per-block processing to per-batch processing. It may later switch back to per-block processing when the queue length 222 falls below the high-water mark 224 (or when it falls below some lower threshold, to prevent chattering). In other examples, the adaptive compression manager 160 uses per-batch processing under other circumstances, which may be independent of busyness.

Per-batch processing may proceed by identifying a batch 350 of M blocks in the input queue 220, where M may be several tens, hundreds, or thousands, for example. Compressor 210 may proceed to compress a first N blocks 360 of the M blocks (N<M), e.g., using the slow/high compression procedure, thus producing N compressed blocks 360c. The batch calculator 250 computes a compression result (CR) 252 of the first N blocks, e.g., by comparing a total size of the N compressed blocks 360c with the size of the N blocks 360 prior to compression.

The compression result 252 may be expressed as a total compressed size of compressed blocks 360c (e.g., across all N blocks), as a mean compressed size of compressed blocks 360c, as a ratio of total compressed size to total uncompressed size, or in any other suitable manner. In the example shown, compression result 252 is expressed as a reduction ratio, such as $$CR = \frac{\text{Uncompressed Size} - \text{Compressed Size}}{\text{Uncompressed Size}}.$$

The batch calculator 250 outputs the compression result 252 of the first N blocks 360 to the orchestrator 260. In response, the orchestrator 260 establishes a CLS value 262 for the rest of the batch 350, e.g., for the remaining M-N blocks 370, based on the compression result 252 for the first N blocks 360. For example, if the first N blocks 360 were only 5% compressible, the orchestrator 260 would set the CLS value 262 to back-off, indicating no compression. The compressor 210 would then perform no compression on the remaining M-N blocks 370 of the batch 350. If the first N blocks were 40% compressible, however, the orchestrator 260 would set the CLS value 262 to the first compression level, causing the compressor 210 to perform fast/low compression on the remaining N-M blocks 370. But if the first N blocks were 75% compressible, the orchestrator 260 would set the CLS value 262 to the second compression level, causing the compressor 210 to perform slow/high compression on the remaining N-M blocks 370.

Although the depicted example bases compression of remaining blocks in a batch on actual compression results obtained by compressing the first N blocks 360, the decision could alternatively be based on average entropy of the first N blocks 360. As before, if any compressed blocks (including headers) turn out to be larger than the system block size (e.g., 4 kB), such compressed blocks may be replaced with their uncompressed counterparts, e.g., from cache 140.

Figure 4:
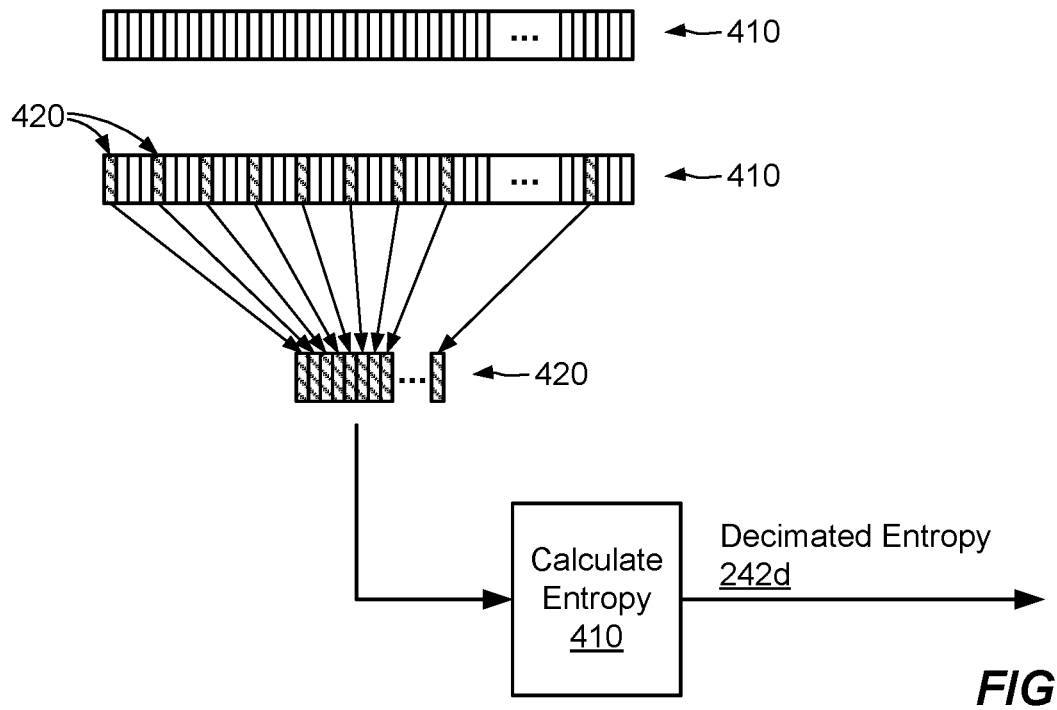
FIG. 4 is a block diagram showing an example arrangement for calculating entropy using byte-based decimation.

FIG. 4 shows an example arrangement for further optimizing entropy calculations. The activities described may be performed, for example, by the entropy calculator 240 of FIG. 2. As shown, a decimation (undersampling) process reduces the number of bytes 420 in a block 410 from which entropy is computed.

For example, the entropy calculator 240 may receive a block 410 and sample particular bytes of the block, such as every fourth, eighth, sixteenth, etc., byte in block 410. The resulting data set 420 is smaller than the original block 410, enabling an entropy calculation to proceed much more quickly. It is noted that the efficient entropy calculation described in incorporated U.S. application Ser. No. 16/669,160 works with variable numbers of bytes and is thus compatible with decimation.

The resulting decimated entropy values 242d may be used for steering compression decisions in the same way that entropy values 242 are used above. The accuracy of decimated entropy values 242d depends on the distribution of information content among bytes in a block. The more even the distribution, the better the accuracy, and the more closely decimated entropy values 242d match with undecimated entropy values.

In some examples, the adaptive compression manager 160 may initially be configured to operate the entropy calculator 240 without decimation. It may further be configured to switch operation of the entropy calculator 240 to a decimation mode when the system gets busy and/or when it is compressing certain types of data, e.g., that known to have uniform information content, such as text.

FIGS. 5-8 show example methods that may be carried out in connection with the environment 100. Such methods are typically performed, for example, by the software constructs described in connection with FIG. 1, which reside in the memory 130 of the computing node 120a and are run by the processor(s) 124. The various acts of the depicted methods may be ordered in any suitable way. Accordingly, embodiments may be constructed in which acts are performed in orders different from those illustrated, which may include performing some acts simultaneously.

Figure 5:
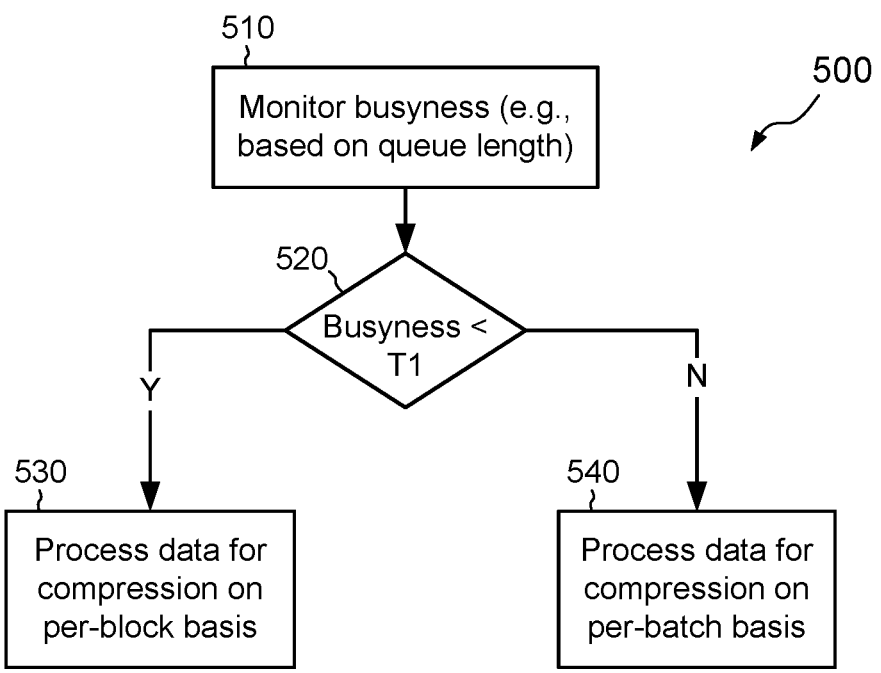
FIG. 5 is a flowchart showing an example method of selectively performing data compression in the environment of FIG. 1.

FIG. 5 shows an example method 500 for managing data compression in the environment of FIG. 1. Method 500 may be carried out by the adaptive compression manager 160, for example.

At 510, the adaptive compression manager 160 monitors system busyness, e.g., by monitoring the length 222 of the input queue 220 to compressor 210 (FIG. 2). Additional factors may be considered in evaluating busyness, such as memory usage, CPU utilization, and the like.

At 520, the adaptive compression manager 160 determines whether the monitored busyness falls below a predetermined threshold T1. If so, operation proceeds to 530, whereupon the adaptive compression manager 160 processes data for compression on a per-block basis, such as described above in connection with FIG. 3A. If not, operation proceeds to 540, whereupon the adaptive compression manager 160 processes data for compression on a per-batch basis, such as described above in connection with FIG. 3B.

In an example, threshold T1 corresponds to the high-water mark 224 of the input queue 220 (FIG. 2). Busyness below threshold T1 thus corresponds to length 222 of the input queue 220 being below the high-water mark 224. Likewise, busyness exceeding threshold T1 corresponds to length 222 of the input queue 220 exceeding the high-water mark 224.

Figure 6:
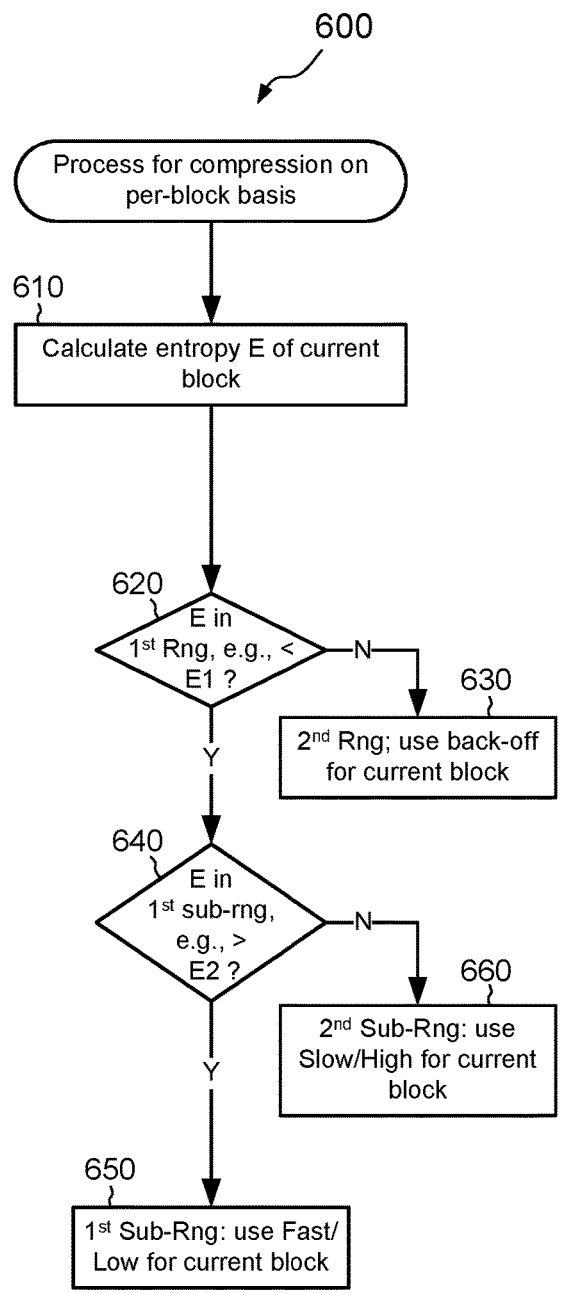
FIG. 6 is a flowchart showing an example method of performing compression on a per-block basis.

FIG. 6 shows an example method 600 of processing data for compression on a per-block basis. FIG. 6 thus presents a more expanded view of act 530 of FIG. 5.

At 610, entropy calculator 240 calculates the entropy of a current block. The calculation may be based on the entire block or a decimated version thereof. Orchestrator 260 compares the calculated entropy "E" with one or more thresholds to determine how to treat the current block for compression.

For example, at 620, orchestrator 260 determines whether the entropy E of the current block falls within a first range or within a second range. Entropy values within the first range are processed for compression, whereas entropy values within the second range are not. A threshold E1 distinguishes the first range from the second range and may be set to a high value, such as 90%. Blocks with entropy values that fall within the second range are thus uncompressible or compressible to such as small extent that there is little or no benefit to compressing them. If the entropy of the current block falls outside the first range, operation proceeds to 630, whereupon the orchestrator 260 selects back-off for the current block, indicating that no compression is to be performed. Otherwise, operation proceeds to 640.

Given that the illustrated embodiments support two levels of compression, an additional comparison may be performed (at 640) to determine whether the entropy of the current block falls within a first sub-range or a second sub-range of the first range. Here, threshold E2 distinguishes the two subranges and may assume an intermediate entropy value, such as 50%. If the current block has an entropy value less than E2, operation proceeds to 650, whereupon the current block may be processed using the first compression procedure (e.g., fast/low). Otherwise, operation may proceed to 660, whereupon the current block may be processed using the second compression procedure (e.g., slow/high). The current block is then processed, and a next block in the input queue 220 may be identified as a new current block, at which point the method 600 is repeated.

One should appreciate that the particular operation as shown in method 600 may be varied while achieving similar results. For example, the particular thresholds can be varied. Also, additional sub-ranges may be added, for supporting additional compression levels. Thus, FIG. 6 is intended to be illustrative rather than limiting.

Figure 7:
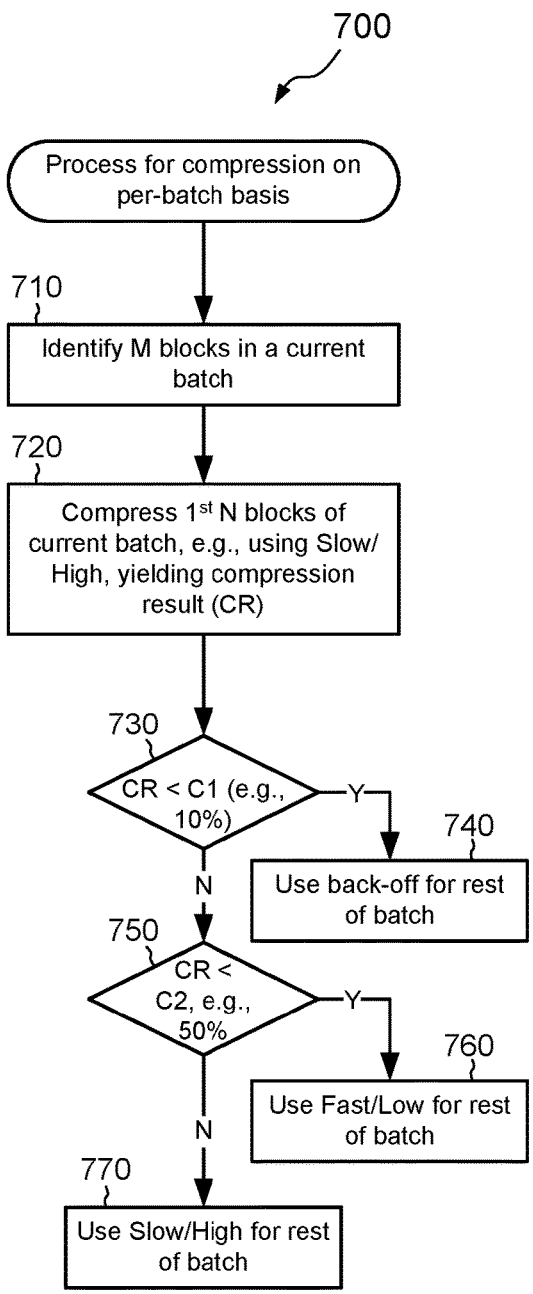
FIG. 7 is a flowchart showing an example method of performing compression on a per-batch basis.

FIG. 7 shows an example method 700 of processing data for compression on a per-batch basis. FIG. 7 thus presents a more expanded view of act 540 of FIG. 5.

At 710, a current batch 350 is identified. For example, the batch is identified as M blocks 350 within the input queue 220 of the adaptive compression manager 160. In an example, the batch corresponds to a set of blocks being processed as part of a flush transaction from cache 140.

At 720, the adaptive compression manager 160 compresses a first N blocks 360 of the current batch, e.g., as shown in FIG. 3B, thus yielding compressed blocks 360c. In an example, blocks 360 are compressed using the slow/high compression procedure. Batch calculator 250 then computes a compression result 252 of the N-block compression. In the example shown, compression result 252 is expressed as a reduction ratio, such as that described in connection with FIG. 3B. The acts that follow then have the effect of steering compression of the remaining M-N blocks 370 of the current batch based on the results obtained by compressing the first N blocks 350.

For example, at 730 the orchestrator 260 determines whether the compression result (CR) falls below a first threshold C1, which may represent a minimal reduction in size, such as 10%. If the compression result falls below C1 (indicating less than 10% reduction), operation proceeds to 740, whereupon the orchestrator 260 applies back-off (no compression) to the remaining M-N blocks 370 of the current batch.

At 750, the orchestrator 260 determines whether CR falls below a second threshold C2, which may represent a good reduction in size, such as 50%. If CR for the first N blocks 350 falls below C2, indicating only fair data reduction, operation proceeds to 760, whereupon the orchestrator 260 applies the fast/low compression procedure to the remaining M-N blocks 370 in the current batch.

Otherwise, if the orchestrator 260 determines that CR exceeds C2 (indicating good-to-excellent compression), operation proceeds to 770, whereupon the orchestrator 260 applies the slow/high compression procedure to the remaining M-N blocks 370 in the current batch. In this manner, slow/high compression is performed on blocks that are expected to be highly compressible, whereas fast/low compression is performed on blocks that are expected to be somewhat less compressible. The method 700 may then be repeated for a next batch of blocks.

The particular operation as shown in method 700 may be varied while achieving similar results. Also, one can readily see that the particular thresholds can be varied. Thus, FIG. 7 is intended to be illustrative rather than limiting.

Figure 8:
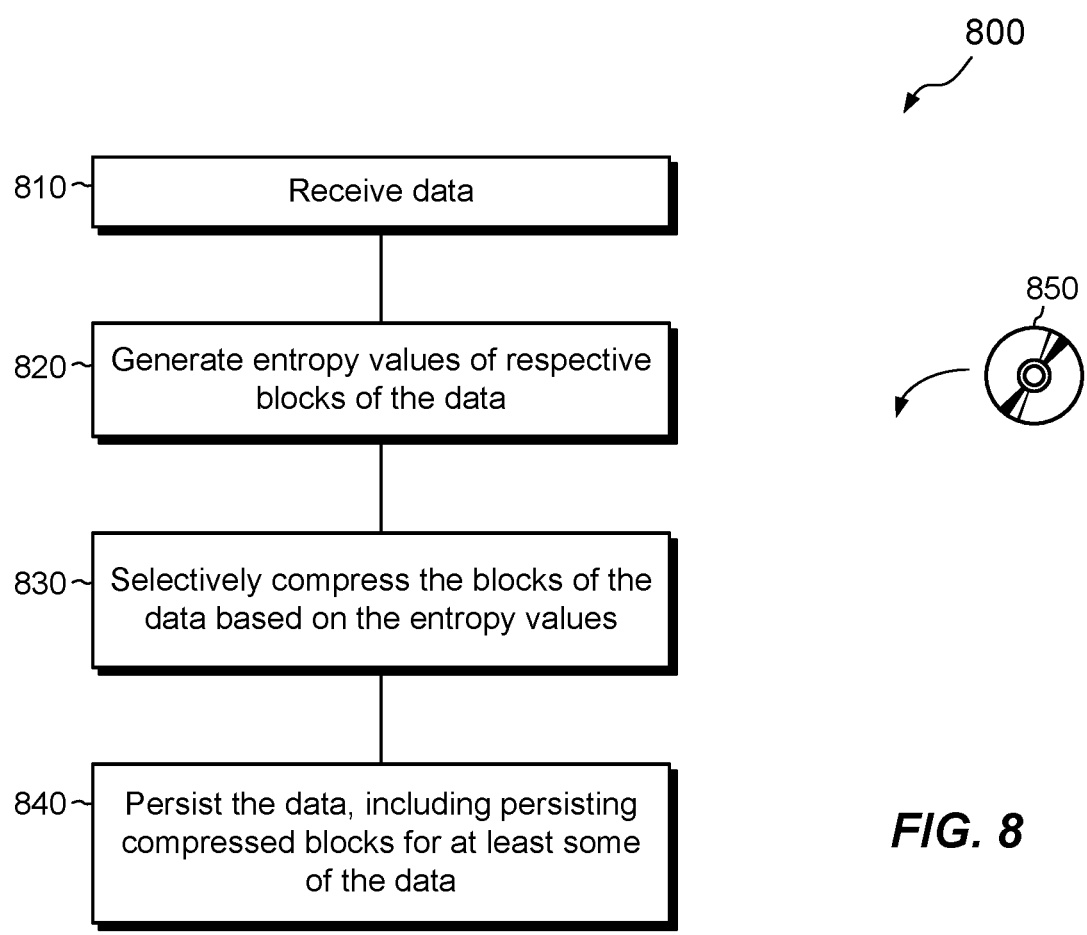
FIG. 8 is a flowchart showing an example method of managing data storage in the environment of FIG. 1.

FIG. 8 shows a method 800 that may be carried out in the environment 100 and provides a high-level review of some of the features described above.

At 810, data is received. As shown in FIG. 1, for example, computing node 120a may receive data arriving in write I/O requests issued by hosts 110. The computing node 120a may receive such data into cache 140, which organizes the data into blocks 142.

At 820, entropy values are generated from respective blocks of the data received. For example, entropy calculator 240 (FIG. 2), running within adaptive compression manager 160, generates per-block entropy values 242 of blocks 152, e.g., blocks received into cache 140 but not deduplicated. The entropy calculator 240 may generate entropy values on all such blocks or any subset of them. For example, entropy calculator 240 may operate on a sampling basis. Also, entropy calculator 240 may operate with byte-based decimation or without.

At 830, the blocks of the data are selectively compressed based on the entropy values. For example, orchestrator 260 (FIG. 2) may direct compressor 210 to compress blocks in the input queue 220 based on the entropy values 242 calculated for the respective blocks, such as by using back-off for high-entropy blocks, fast/low compression for moderate entropy blocks, and slow/high compression for low-entropy blocks. If sampling is used, the entropy calculated on sampled blocks may be used in steering compression decisions for nearby, unsampled blocks.

At 840, the data is persisted, which includes persisting compressed blocks for at least some of the data. For example, blocks 162 processed by the adaptive compression manager 160 may be persisted to storage 180. Such blocks 162 may include both compressed blocks and uncompressed blocks.

An improved technique has been described for managing data storage. The technique includes generating entropy of blocks on a per-block basis and selectively performing inline compression on blocks based at least in part on their entropy. Entropy of a block can be computed inexpensively and provides a rough measure of the block's compressibility. Thus, using per-block entropy enables a storage system to steer compression decisions, e.g., whether to compress and/or how much to compress, flexibly and with high granularity, striking a balance between throughput and storage efficiency.

Having described certain embodiments, numerous alternative embodiments or variations can be made. For instance, a certain efficient entropy calculation is described. But this is merely one suitable example. Also, a particular hardware accelerator is described. But this is also merely one example. Neither example is intended to be limiting.

Further, although features have been shown and described with reference to particular embodiments hereof, such features may be included and hereby are included in any of the disclosed embodiments and their variants. Thus, it is understood that features disclosed in connection with any embodiment are included in any other embodiment.

Further still, the improvement or portions thereof may be embodied as a computer program product including one or more non-transient, computer-readable storage media, such as a magnetic disk, magnetic tape, compact disk, DVD, optical disk, flash drive, solid state drive, SD (Secure Digital) chip or device, Application Specific Integrated Circuit (ASIC), Field Programmable Gate Array (FPGA), and/or the like (shown by way of example as medium 850 in FIG. 8). Any number of computer-readable media may be used. The media may be encoded with instructions which, when executed on one or more computers or other processors, perform the process or processes described herein. Such media may be considered articles of manufacture or machines, and may be transportable from one machine to another.

As used throughout this document, the words "comprising," "including," "containing," and "having" are intended to set forth certain items, steps, elements, or aspects of something in an open-ended fashion. Also, as used herein and unless a specific statement is made to the contrary, the word "set" means one or more of something. This is the case regardless of whether the phrase "set of" is followed by a singular or plural object and regardless of whether it is conjugated with a singular or plural verb. Also, a "set of" elements can describe fewer than all elements present. Thus, there may be additional elements of the same kind that are not part of the set. Further, ordinal expressions, such as "first," "second," "third," and so on, may be used as adjectives herein for identification purposes. Unless specifically indicated, these ordinal expressions are not intended to imply any ordering or sequence. Thus, for example, a "second" event may take place before or after a "first event," or even if no first event ever occurs. In addition, an identification herein of a particular element, feature, or act as being a "first" such element, feature, or act should not be construed as requiring that there must also be a "second" or other such element, feature or act. Rather, the "first" item may be the only one. Also, and unless specifically stated to the contrary, "based on" is intended to be nonexclusive. Thus, "based on" should not be interpreted as meaning "based exclusively on" but rather "based at least in part on" unless specifically indicated otherwise. Although certain embodiments are disclosed herein, it is understood that these are provided by way of example only and should not be construed as limiting.

Those skilled in the art will therefore understand that various changes in form and detail may be made to the embodiments disclosed herein without departing from the scope of the following claims.

What is claimed is:

1. A method of managing data storage, comprising:
   receiving data;
   generating entropy values of respective blocks of the data;
   selectively compressing the blocks of the data based on the entropy values; and
   persisting the data, including persisting compressed blocks for at least some of the data,
   wherein selectively compressing the blocks of the data includes:
      compressing a first set of blocks having entropy values within a first range; and
      skipping compression of a second set of blocks having entropy values outside the first range,
   wherein compressing the first set of blocks includes:
      compressing a first subset of blocks having entropy values within a first sub-range of the first range using a first compression procedure; and
      compressing a second subset of blocks having entropy values within a second sub-range of the first range using a second compression procedure,
   wherein blocks of the data are arranged in a queue,
   wherein the method further comprises determining, based on system busyness, whether to process the data on a per-block basis or a per-batch basis,
   wherein, when processing data on a per-batch basis:
      generating entropy values of respective blocks of the data is performed by sampling fewer than all blocks in the queue, and
      the method further comprises selectively compressing un-sampled blocks in the queue based on entropy values generated from one or more sampled blocks in the queue.

2. The method of claim 1, wherein the first compression procedure executes faster than the second compression procedure and yields a lesser degree of data compression than the second compression procedure.

3. The method of claim 1, wherein generating entropy values of respective blocks includes, for at least one block, generating an entropy value based on sampling bytes within the respective block, the entropy value thus reflecting sampled bytes but not un-sampled bytes within the respective block.

4. The method of claim 1, wherein blocks of the data are arranged in a queue, and wherein the method further comprises disabling the second compression procedure in response to a length of the queue exceeding a predetermined high water mark.

5. The method of claim 1, further comprising:
   providing a set of M blocks of data;
   determining a compressibility level of a first N blocks of the M blocks of data (N<M);
   based on the compressibility level of the first N blocks, selecting a processing procedure as one of (i) no compression, (ii) the first compression procedure, or (iii) the second compression procedure; and
   processing a remaining M-N blocks of the M blocks using the selected processing procedure.

6. The method of claim 5, wherein the ordered set of M blocks of data are blocks contained within a flush transaction for flushing the M blocks of data from a cache.

7. The method of claim 1, wherein persisting the data includes:
   storing a compressed block with a compression header that includes metadata describing a compression procedure used to compress the compressed block; and
   storing an uncompressed block without a compression header.

8. A computerized apparatus, comprising control circuitry that includes a set of processing units coupled to memory, the control circuitry constructed and arranged to:
   receive data;
   generate entropy values of respective blocks of the data;
   selectively compress the blocks of the data based on the entropy values; and
   persist the data, including compressed blocks for at least some of the data,
   wherein the control circuitry constructed and arranged to selectively compress the blocks of the data is further constructed and arranged to:
      compress a first set of blocks having entropy values within a first range; and
      skip compression of a second set of blocks having entropy values outside the first range,
   wherein the control circuitry constructed and arranged to compress the first set of blocks is further constructed and arranged to:
      compress a first subset of blocks having entropy values within a first sub-range of the first range using a first compression procedure; and
      compress a second subset of blocks having entropy values within a second sub-range of the first range using a second compression procedure,
   wherein the control circuitry is further constructed and arranged to determine, based on system busyness, whether to process the data on a per-block basis or a per-batch basis, and
   wherein, when processing data on a per-batch basis, the control circuitry constructed and arranged to generate entropy values of respective blocks is further constructed and arranged, for at least one block, to generate an entropy value based on sampling bytes within the respective block, the entropy value thus reflecting sampled bytes but not un-sampled bytes within the respective block.

9. A computer program product including a set of non-transitory, computer-readable media having instructions which, when executed by control circuitry of a computerized apparatus, cause the computerized apparatus to perform a method of managing data storage, the method comprising:
   receiving data;
   generating entropy values of respective blocks of the data;
   selectively compressing the blocks of the data based on the entropy values; and
   persisting the data, including persisting compressed blocks for at least some of the data,
   wherein selectively compressing the blocks of the data includes:
      compressing a first set of blocks having entropy values within a first range; and skipping compression of a second set of blocks having entropy values outside the first range, wherein compressing the first set of blocks includes:

compressing a first subset of blocks having entropy values within a first sub-range of the first range using a first compression procedure; and compressing a second subset of blocks having entropy values within a second sub-range of the first range using a second compression procedure;

wherein the method further comprises determining. based on system busyness, whether to process the data on a per-block basis or a per-batch basis, wherein, when processing data on a per-batch basis, the method further comprises:

providing a set of M blocks of data;

determining a compressibility level of a first N blocks of the M blocks of data (N<M);

based on the compressibility level of the first N blocks, selecting a processing procedure as one of (i) no compression, (ii) the first compression procedure, or (iii) the second compression procedure; and processing a remaining M-N blocks of the M blocks using the selected processing procedure.

10. The computer program product of claim 9, wherein the first compression procedure executes faster than the second compression procedure and yields a lesser degree of data compression than the second compression procedure.

11. The computer program product of claim 9, wherein blocks of the data are arranged in a queue, wherein generating entropy values of respective blocks of the data is performed by sampling fewer than all blocks in the queue, and wherein the method further comprises selectively compressing un-sampled blocks in the queue based on entropy values generated from one or more sampled blocks in the queue.

12. The computer program product of claim 9, wherein generating entropy values of respective blocks includes, for at least one block, generating an entropy value based on sampling bytes within the respective block, the entropy value thus reflecting sampled bytes but not un-sampled bytes within the respective block.

13. The computer program product of claim 9, wherein blocks of the data are arranged in a queue, and wherein the method further comprises disabling the second compression procedure in response to a length of the queue exceeding a predetermined high water mark.

14. The computer program product of claim 9, wherein the ordered set of M blocks of data are blocks contained within a flush transaction for flushing the M blocks of data from a cache.

15. The method of claim 1, wherein sampling fewer than all blocks in the queue further includes generating entropy values of noncontiguous blocks in the queue.

16. The method of claim 15, wherein generating entropy values of noncontiguous blocks in the queue further includes selecting blocks in the queue at regular intervals.

* * * * *